United States Patent
Sun et al.

(10) Patent No.: US 9,768,058 B2
(45) Date of Patent: Sep. 19, 2017

(54) METHODS OF FORMING AIR GAPS IN METALLIZATION LAYERS ON INTEGRATED CIRCUIT PRODUCTS

(71) Applicant: GLOBALFOUNDRIES Inc., Grand Cayman (KY)

(72) Inventors: Zhiguo Sun, Halfmoon, NY (US); Qiang Fang, Ballston Lake, NY (US); Christian Witt, Woodbridge, CT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/822,258

(22) Filed: Aug. 10, 2015

(65) Prior Publication Data

US 2017/0047242 A1    Feb. 16, 2017

(51) Int. Cl.
| | |
|---|---|
| *H01L 21/311* | (2006.01) |
| *H01L 21/768* | (2006.01) |
| *H01L 21/02* | (2006.01) |
| *H01L 21/764* | (2006.01) |
| *H01L 23/52* | (2006.01) |

(52) U.S. Cl.
CPC ...... *H01L 21/764* (2013.01); *H01L 21/02068* (2013.01); *H01L 21/02356* (2013.01); *H01L 21/31111* (2013.01); *H01L 21/76883* (2013.01)

(58) Field of Classification Search
CPC ......... H01L 21/76808; H01L 21/76834; H01L 21/76832; H01L 21/764; H01L 21/76802; H01L 23/53295; H01L 23/5222; H01L 23/5329; H01L 23/76832; H01L 21/31111; H01L 21/02068
See application file for complete search history.

(56) References Cited

U.S. PATENT DOCUMENTS

| | | | |
|---|---|---|---|
| 5,869,379 A | 2/1999 | Gardner et al. | 438/305 |
| 5,949,143 A | 9/1999 | Bang | 257/758 |
| 5,953,625 A | 9/1999 | Bang | 438/619 |
| 6,160,316 A | 12/2000 | Gardner et al. | 257/773 |

(Continued)

FOREIGN PATENT DOCUMENTS

| | | | |
|---|---|---|---|
| DE | 112007002215 T5 | 7/2009 | H01L 21/3205 |
| DE | 102008044984 A1 | 7/2010 | H01L 23/522 |

OTHER PUBLICATIONS

Lee and Graves, "The effect of VUV radiation from Ar/O2 plasmas on low-k SiOCH films," *J. Phys. D: Appl. Phys.*, 44:325203, 2011.

(Continued)

*Primary Examiner* — Caridad Everhart
(74) *Attorney, Agent, or Firm* — Amerson Law Firm, PLLC

(57) ABSTRACT

One illustrative method disclosed herein includes, among other things, forming a plurality of trenches in a layer of insulating material, performing at least one damage-causing process operation to selectively damage portions of the insulating material adjacent the trenches, forming a conductive line in each of the trenches, after forming the conductive lines, performing a selective etching process to selectively remove at least portions of the damaged portions of the insulating material and thereby define an air gap positioned laterally adjacent each of the conductive lines, and forming a capping layer of material above the conductive lines, the air gap and the undamaged portion of the layer of insulating material.

19 Claims, 9 Drawing Sheets

(56) References Cited

U.S. PATENT DOCUMENTS

| | | | |
|---|---|---|---|
| 6,312,874 B1 | 11/2001 | Chan et al. | 430/314 |
| 6,376,330 B1 | 4/2002 | Fulford, Jr. et al. | 438/421 |
| 6,713,835 B1 | 3/2004 | Horak et al. | 257/522 |
| 6,737,725 B2 | 5/2004 | Nitta et al. | 257/522 |
| 6,838,354 B2 | 1/2005 | Goldberg et al. | 438/408 |
| 6,838,355 B1 | 1/2005 | Stamper et al. | 438/409 |
| 7,026,235 B1 | 4/2006 | Ben-Tzur et al. | 438/619 |
| 7,319,274 B2 | 1/2008 | Beyer et al. | 257/774 |
| 7,868,455 B2 | 1/2011 | Chen | 257/750 |
| 8,048,796 B2 | 11/2011 | Seidel et al. | 438/618 |
| 8,399,335 B2 | 3/2013 | Huisinga et al. | 438/421 |
| 8,883,610 B2 | 11/2014 | Seidel et al. | 438/411 |
| 2002/0158337 A1 | 10/2002 | Babich et al. | 257/758 |
| 2004/0213971 A1 | 10/2004 | Colburn et al. | 428/209 |
| 2004/0232552 A1 | 11/2004 | Wang et al. | 257/758 |
| 2005/0037604 A1 | 2/2005 | Babich et al. | 438/619 |
| 2006/0073695 A1 | 4/2006 | Filippi et al. | 438/619 |
| 2006/0088975 A1 | 4/2006 | Ueda | 438/421 |
| 2006/0205623 A1* | 9/2006 | Oowada | G03F 7/425 510/175 |
| 2007/0096319 A1 | 5/2007 | Hsu et al. | 257/750 |
| 2007/0099417 A1 | 5/2007 | Fang et al. | 438/656 |
| 2007/0178713 A1 | 8/2007 | Jeng | 438/787 |
| 2007/0259516 A1 | 11/2007 | Jahnes et al. | 438/618 |
| 2008/0073748 A1 | 3/2008 | Bielefeld et al. | 257/522 |
| 2008/0124917 A1 | 5/2008 | Oh et al. | 438/637 |
| 2008/0169542 A1 | 7/2008 | Suzuki et al. | 257/684 |
| 2008/0169565 A1 | 7/2008 | Bonilla et al. | 257/761 |
| 2009/0072409 A1* | 3/2009 | Nitta | H01L 21/76808 257/774 |
| 2010/0270683 A1* | 10/2010 | Usami | H01L 21/7682 257/774 |
| 2015/0332999 A1* | 11/2015 | Ting | H01L 23/53295 257/773 |

OTHER PUBLICATIONS

Translation of Official Communication from German Patent Office for German Patent Application No. 10 2009 023 377.6 dated Oct. 5, 2010.

Translation of Official Communication from German Patent Office for German Patent Application No. 10 2008 059 650.7 dated Sep. 25, 2009.

Translation of Official Communication from German Patent Office for German Patent Application No. 10 2008 059 650.7 dated Nov. 11, 2010.

Translation of Official Communication from German Patent Office for German Patent Application No. 10 2010 030 757.2 dated Feb. 18, 2011.

* cited by examiner

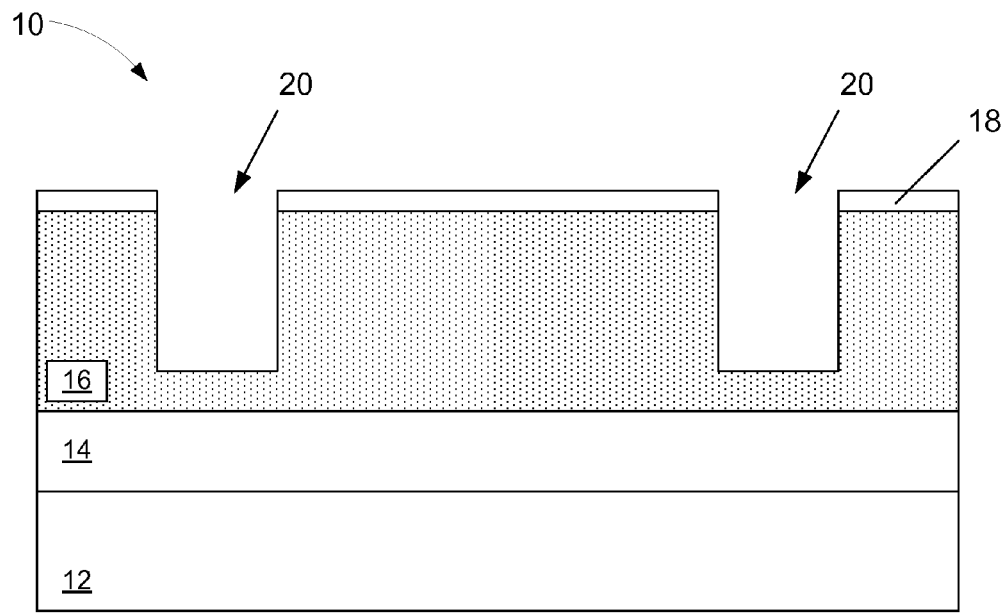
(Prior Art) Figure 1A
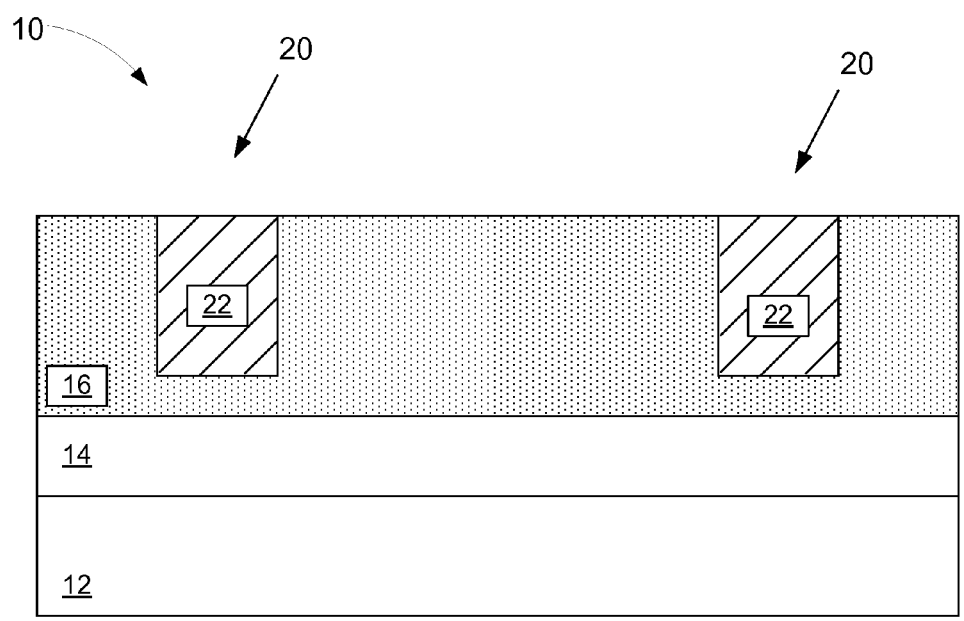
(Prior Art) Figure 1B

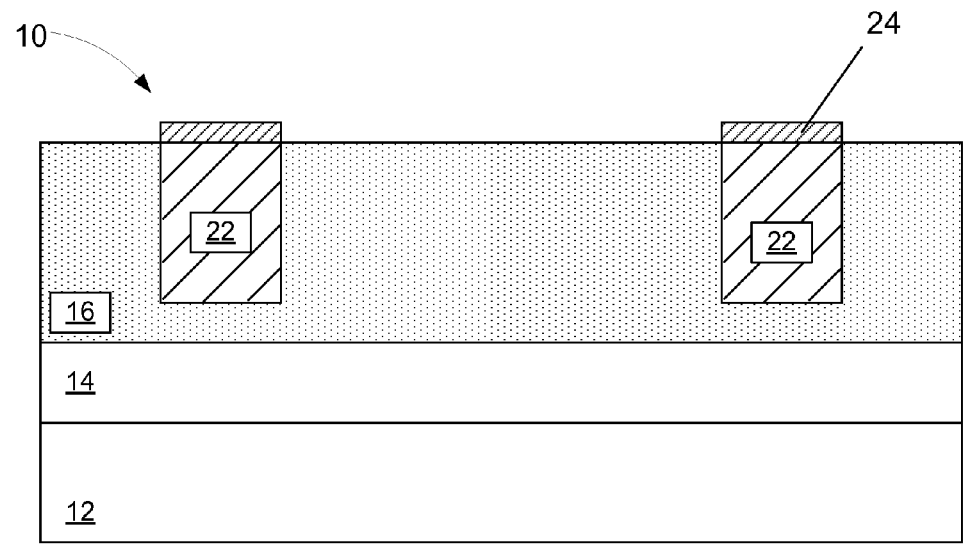
(Prior Art) Figure 1C
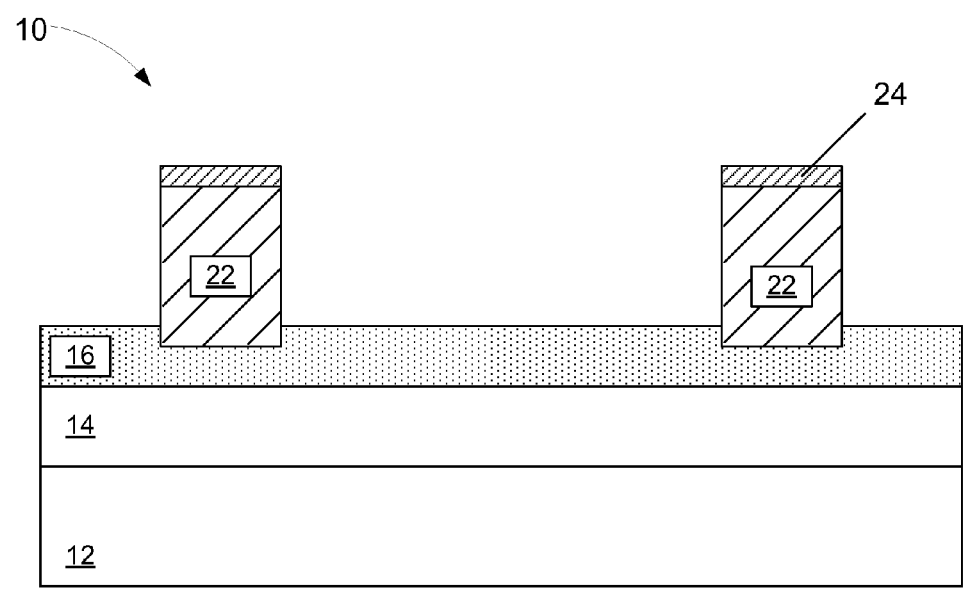
(Prior Art) Figure 1D

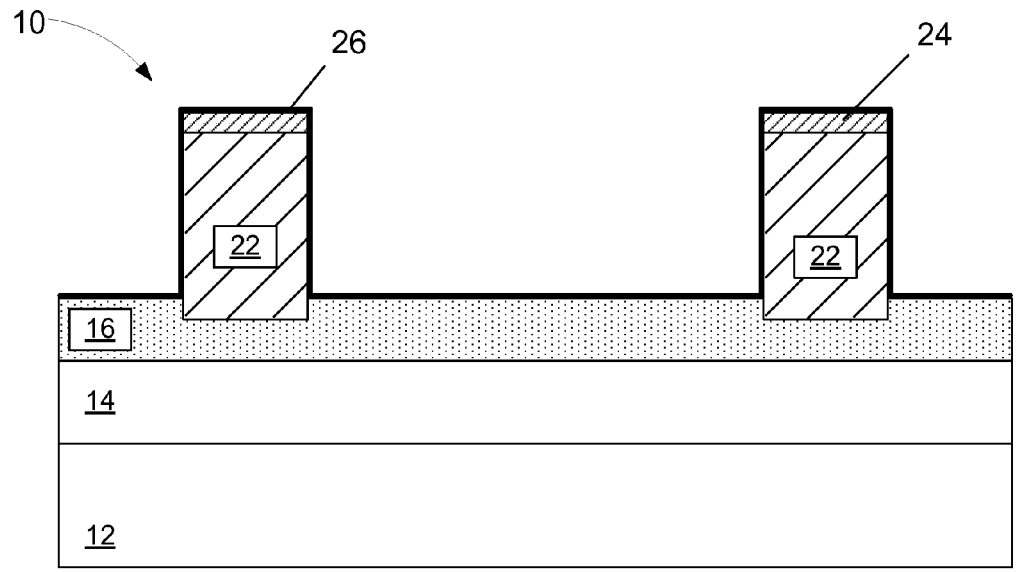
(Prior Art) Figure 1E
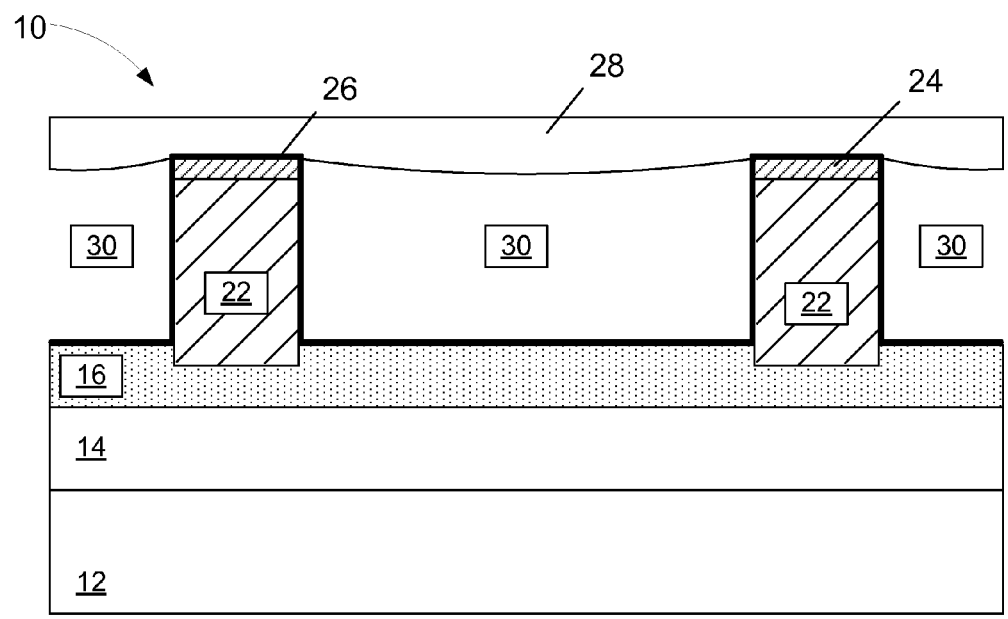
(Prior Art) Figure 1F

METHODS OF FORMING AIR GAPS IN METALLIZATION LAYERS ON INTEGRATED CIRCUIT PRODUCTS

BACKGROUND OF THE INVENTION

1. Field of the Invention

Generally, the present disclosure relates to the manufacture of integrated circuit products, and, more specifically, to various methods of forming air gaps in metallization layers on integrated circuit products.

2. Description of the Related Art

In modern integrated circuits, such as microprocessors, storage devices and the like, a very large number of circuit elements, especially transistors, are provided and operated on a restricted chip area. Generally, in complex circuitry including complex logic portions, MOS technology is presently a preferred manufacturing technique in view of device performance and/or power consumption and/or cost efficiency. In integrated circuits fabricated using MOS technology, field effect transistors (FETs), such as planar field effect transistors and/or FinFET transistors, are provided that are typically operated in a switched mode, i.e., these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time.

Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines and conductive vias formed in the layers of material. Generally, the conductive lines provide the intra-level electrical connections, while the conductive vias provide the inter-level connections or vertical connections between different levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques. Additional metallization layers are formed above the M1 layer, e.g., M2/V1, M3/V2, etc. Within the industry, conductive structures below the V0 level are generally considered to be "device-level" contacts or simply "contacts," as they contact the "device" (e.g., a transistor) that is formed in the silicon substrate.

The continuous reduction of the feature sizes of transistors, and the associated improvement in the performance of such transistor devices has reached the point where one limiting factor relating to the operating speed of the final integrated circuit product is no longer the individual transistor element but the electrical performance of the complex wiring system used to electrically connect all of the actual semiconductor-based circuit elements, such as transistors, that are formed in and above the semiconductor substrate. That is, signal propagation delay may no longer be limited by the field effect transistors but is limited, owing to the increased circuit density, by the interconnect lines in the metallization layers, since the line-to-line capacitance (C) is increased and also the resistance (R) of the lines is increased due to their reduced cross-sectional area. Thus, reduction of the parasitic RC time constants and the capacitive coupling between neighboring metal lines is an ongoing issue when manufacturing integrated circuit products.

In earlier product generations, the metallization layers in integrated circuit products were typically comprised of silicon dioxide and/or silicon nitride, with aluminum as the typical metal. In more recent products, copper has been used instead of aluminum for the material of the conductive lines due to the significantly lower electrical resistance and a higher resistivity against electromigration of copper as compared to aluminum. For highly sophisticated applications, in addition to using copper and/or copper alloys, the well-established and well-known dielectric materials silicon dioxide ($k \approx 4.2$) and silicon nitride ($k > 7$) may increasingly be replaced by so-called low-k dielectric materials having a relative permittivity of approximately 3.0 and less.

In addition to using such low-k materials, another technique that device designers have employed to reduce the capacitive coupling between the conductive lines in metallization layers involves the intentional formation of air gaps in the insulating materials in those metallization layers. Air or similar gases have a dielectric constant of approximately 1.0, thereby providing reduced overall permittivity of the interconnect system. FIGS. 1A-1F depict one illustrative prior art technique employed to form air gaps in metallization layers.

FIG. 1A depicts a prior art integrated circuit product 10 that is formed in and above a semiconductor substrate 12. Also depicted is an ILD layer 14, e.g., silicon dioxide. The ILD layer 14 is formed on and above the individual semiconductor devices (not shown), such as transistors. Also depicted is an illustrative metallization layer comprised of a layer of insulating material 16, e.g., silicon dioxide or a low-k material, and a patterned layer of silicon nitride 18 that acts as an etch mask when forming the trenches 20 in the layer of insulating material 16. The metallization layer shown in FIG. 1A is representative of any of the metallization layers that may be formed above the substrate 12, e.g., the M1 layer, M2, M7, etc. At the point of processing depicted in FIG. 1A, a plurality of trenches 20 have been formed by performing a plurality of traditional masking and etching processes. Eventually, conductive metal lines, e.g., copper lines, will be formed in the trenches 20.

FIG. 1B depicts the product after illustrative and simplistically depicted conducting lines 22 (e.g., copper lines) were formed in the trenches 20. The conductive lines 22 typically also include one or more barrier layers (not separately shown) that are formed between the insulating material and the copper material of the lines 22 to prevent or reduce electromigation of the copper material. In the case where the lines are comprised of copper, a typical process of forming the lines 22 includes the following steps. First, a conformal barrier layer is deposited on the product such that it lines the bottom surface and sidewalls of the trenches 20. Next, a thin copper seed layer is formed on the product, followed by performing an electroplating process to deposit bulk copper material in such quantities that it overfills the trenches 20. Thereafter, one or more chemical mechanical polishing (CMP) processes are performed to remove excess conductive material positioned outside of the trenches 20. These CMP processes also remove the layer 18.

FIG. 1C depicts the product 10 after a selective deposition process was performed to selectively form a conductive cap layer 24, e.g., cobalt on the conductive lines 22.

FIG. 1D depicts the product 10 after a timed, recess etching process was performed on the layer of insulating material 16 to reduce its thickness and thereby expose portions of the conductive lines 22. The amount of recessing of the insulating material 16 may vary depending upon the particular application.

FIG. 1E depicts the product 10 after a conformal deposition process was performed to form a relatively thin etch stop layer 26, e.g., silicon nitride, on the product 10 and particularly on the conductive lines 22.

FIG. 1F depicts the product 10 after a layer of material 28 was formed on the product 10 and after a CMP process was performed to planarize its upper surface. The layer of material 28 may be comprised of a material such as silicon nitride, and it may be formed to a thickness of about 10-30 nm. The lateral spacing between the conductive lines 22 is small enough (e.g., 20-40 nm) such that the layer of material 28 does not fill a substantial portion of that lateral space. This results in the formation of air gaps 30 between the adjacent conductive lines 22. While the process shown in FIGS. 1A-1F can be employed to form air gaps, it can be very challenging to integrate.

The present disclosure is directed to various methods of forming air gaps in metallization layers on integrated circuit products that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming air gaps in metallization layers on integrated circuit products. One illustrative method disclosed herein includes, among other things, forming a plurality of laterally spaced-apart trenches in a layer of insulating material, performing at least one damage-causing process operation to selectively damage portions of the layer of insulating material adjacent the trenches while leaving another portion of the layer of insulating material positioned laterally between the laterally spaced-apart trenches undamaged by the at least one damage-causing process operation, forming a conductive line in each of the laterally spaced-apart trenches, after forming the conductive lines, performing a selective etching process to selectively remove at least portions of the damaged portions of the layer of insulating material and thereby define an air gap positioned laterally adjacent each of the conductive lines, and forming a capping layer of material above the conductive lines, the air gaps and the undamaged portion of the layer of insulating material.

Another illustrative method disclosed herein includes, among other things, forming a plurality of laterally spaced-apart, initial depth trenches in a layer of insulating material, performing at least one damage-causing process operation to selectively damage portions of the insulating material adjacent the initial depth trenches while leaving another portion of the insulating material positioned laterally between the laterally spaced-apart initial depth trenches undamaged by the damage-causing process operation, and performing an anisotropic etching process to extend the initial depth of the initial depth trenches to a second greater depth that is greater than the initial depth and to remove a portion of the damaged portions of the insulating material positioned at a bottom of the initial depth trenches while leaving remaining portions of the damaged portions of the insulating material positioned adjacent sidewalls of the trenches with the second depth intact. In this example, the method further includes forming a conductive line in each of the laterally spaced-apart trenches having the second depth, after forming the conductive lines, performing a selective etching process to selectively remove the damaged portions of the layer of insulating material and thereby define an air gap positioned on opposite sides of each of the conductive lines, performing a conformal deposition process to form a conformal etch stop liner layer on an upper surface of the layer of insulating material, on portions of the insulating material that partially define the air gaps and above the conductive lines, and forming a capping layer of material on and in contact with the conformal etch stop liner layer and above the conductive lines, above the air gaps and above the undamaged portion of the layer of insulating material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict one illustrative prior art technique employed to form air gaps in metallization layers.

Figure 2A:
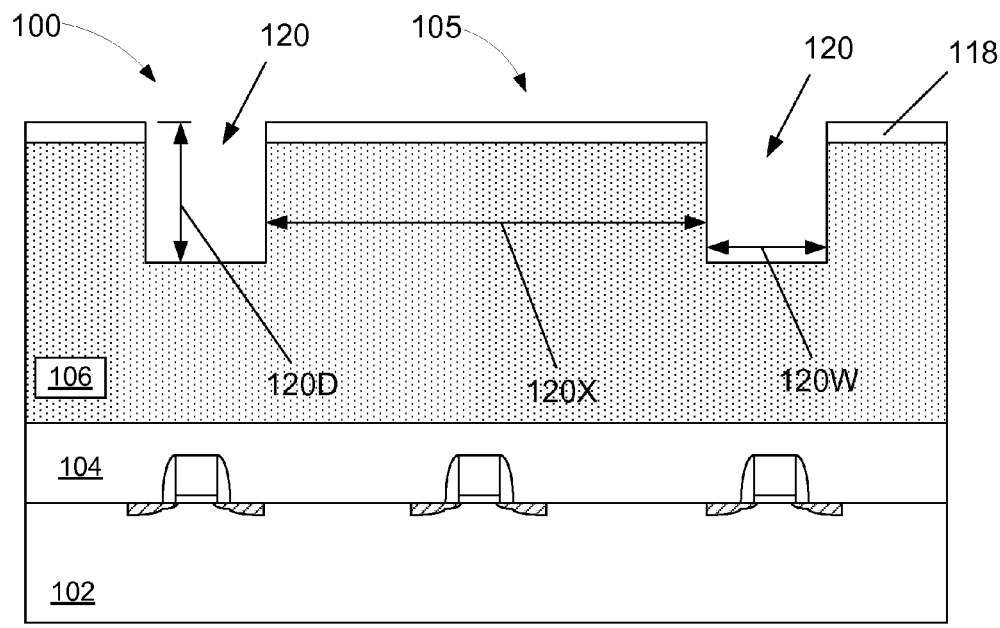
FIGS. 2A-2L depict various illustrative methods disclosed herein for forming air gaps in metallization layers on integrated circuit products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming air gaps in metallization layers on integrated circuit products. As will be readily apparent to those skilled in the art upon a complete reading of the present application, the methods disclosed herein may be employed in manufacturing a variety of different integrated circuit products, including, but not limited to, logic products, memory products, etc. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, electroplating, electroless deposition, etc. Moreover, as used herein and in the attached claims, the word "adjacent" is to be given a broad interpretation and should be interpreted to cover situations where one feature actually contacts another feature or is in close proximity to that other feature.

FIGS. 2A-2L depict various illustrative methods disclosed herein for forming air gaps in metallization layers on integrated circuit products. FIG. 2A depicts an illustrative integrated circuit product 100 that is formed in and above a semiconductor substrate 102. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semi-conductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

Also depicted in FIG. 2A is an ILD layer 104, e.g., silicon dioxide. The ILD layer 104 is formed on and above the individual semiconductor devices, such as transistors (that are simplistically depicted in FIG. 2A only), that are formed in and above the substrate 102. Also depicted is an illustrative metallization layer 105 comprised of an illustrative layer of insulating material 106, e.g., silicon dioxide or a low-k material (k value less than 3), and a patterned cap layer 118, e.g., silicon nitride, that may act as a patterned etch mask when forming the trenches 120 in the layer of insulating material 106. Examples of such low-k materials include, but are not limited to, organo silicate glass (OSG), borophosphosilicate glass (BPSG), borosilicate glass (BSG), phosphosilicate glass (PSG), polyarylene ether, hydrogen silsesquioxane (HSQ), methyl silsesquioxane (MSQ), poly-silsequioxane, polyimide, benzocyclobutene, polytetrafuoroethylene (PTFE), and fluorinated silicate glass (FSG). The width 120W and depth 120D as well as the lateral spacing 120X between the trenches 120 may vary depending upon the particular application. In one illustrative example, the lateral spacing 120X may be on the order of about 20-40 nm. The drawings included in this application are not to scale.

The metallization layer 105 shown in FIG. 2A is intended to be representative of any of the metallization layers that may be formed above the substrate 102, e.g., the M1 layer, M3, M6, etc. At the point of processing depicted in FIG. 2A, a plurality of trenches 120 have been formed by performing a plurality of traditional masking and etching processes. Eventually, conductive metal lines, e.g., copper lines, will be formed in the trenches 120.

Figure 2B:
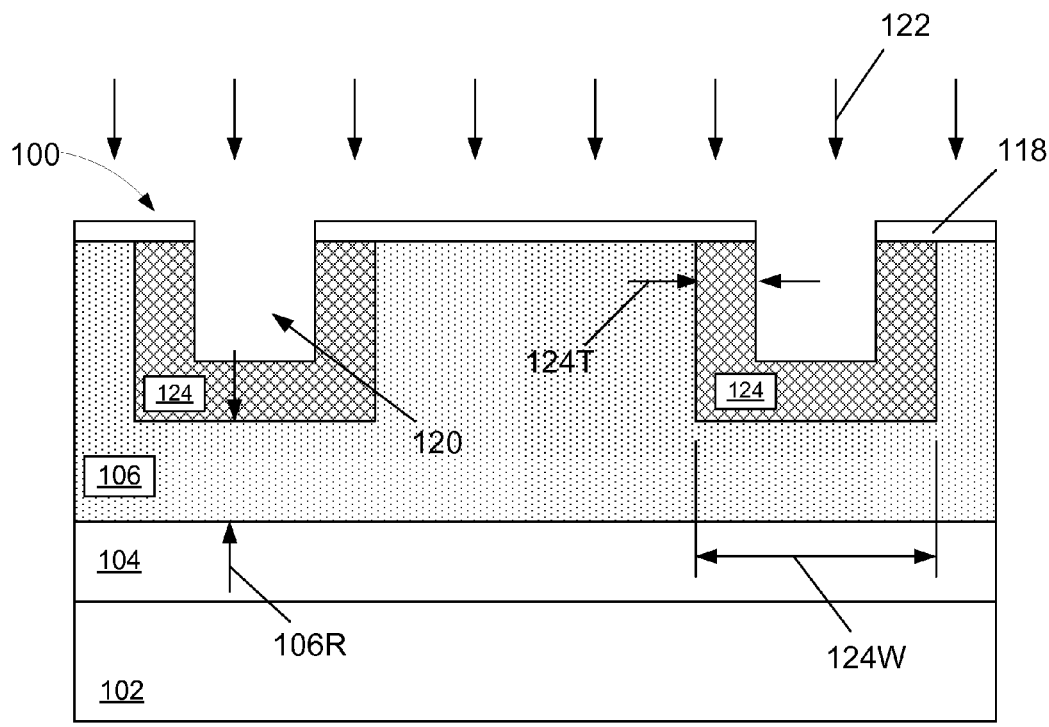

FIG. 2B depicts the product 100 after a damage-causing process operation 122 was performed through the patterned cap layer 118 so as to intentionally damage portions of the insulating material 106 and thereby define damaged regions 124 of the layer of insulating material 106. In one illustrative example, the process operation 122 may be an ashing process or a wet clean process using TMAH (tetramethylammonium hydroxide) as the cleaning agent. The damage-causing process operation 122 is controlled so as to limit the extent of the damage caused to the insulating material 106. In the illustrative example where the damage-causing process operation 122 is an ashing process, it may be an $O_2$, $O_3$ or $N_2O$ based ashing process. The ashing process may involve use of a direct plasma source or a remote plasma source. An ashing process is typically performed to remove layers of photoresist material. However, in this application, the ashing process was performed so as to intentionally "damage" a significant portion of the insulating material 106, especially when it is a low-k material, by forming a hydrophilic layer that will easily absorb moisture from the environment and result in the damaged region having a higher dielectric constant. When the insulating material 106 is a carbon-rich material, the ashing process will damage the insulating material 106 by causing a depletion of carbon in the insulating material 106.

Typically, device manufacturers undertake significant efforts to avoid damaging the insulating material 106 because the presence of such damaged insulating material will tend to make the resulting device exhibit higher leakage and device reliability will be degraded. As a result of damaging portions of the layer of insulating material 106, the etch resistance characteristics of the affected portions of the layer of insulating material 106 are changed. Accordingly, the damaged regions 124 may be more easily etched than the remaining non-damaged portion of the layer of insulating material 106. That is, by performing the damage-causing process operation 122, an etching process may be performed to remove the damaged regions 124 selectively to the non-damaged portions of the layer of insulating material 106, as described more fully below. The lateral width 124W and thickness 124T of the damaged regions 124 may vary depending upon the particular application. In one illustrative example, the lateral width 124W may be on the order of about 1-10 nm, while the thickness 124T may be on the order of about 0.5-5 nm. In the depicted example, the damaged regions 124 are depicted as having a substantially uniform thickness 124T. In a real world device, the damaged regions 124 may not have a single uniform thickness 124T, as the damaged region 124 may be thicker at the bottom of the trench 120 than it is at the sides of the trench 120. The lateral width 124W and the thickness 124T of the damaged regions 124 may be controlled by controlling parameters of the ashing process 122, such as time, temperature, pressure, ambient, etc. Additionally, in one embodiment, the damage-causing process operation 122 may be controlled such that there is a remaining non-damaged portion 106R of the layer of insulating material 106 positioned between the damaged region 124 and an underlying layer of material, e.g., the layer 104 in the depicted example. In some cases, the thickness of this remaining portion 106R may be about 2-20 nm.

Figure 2C:
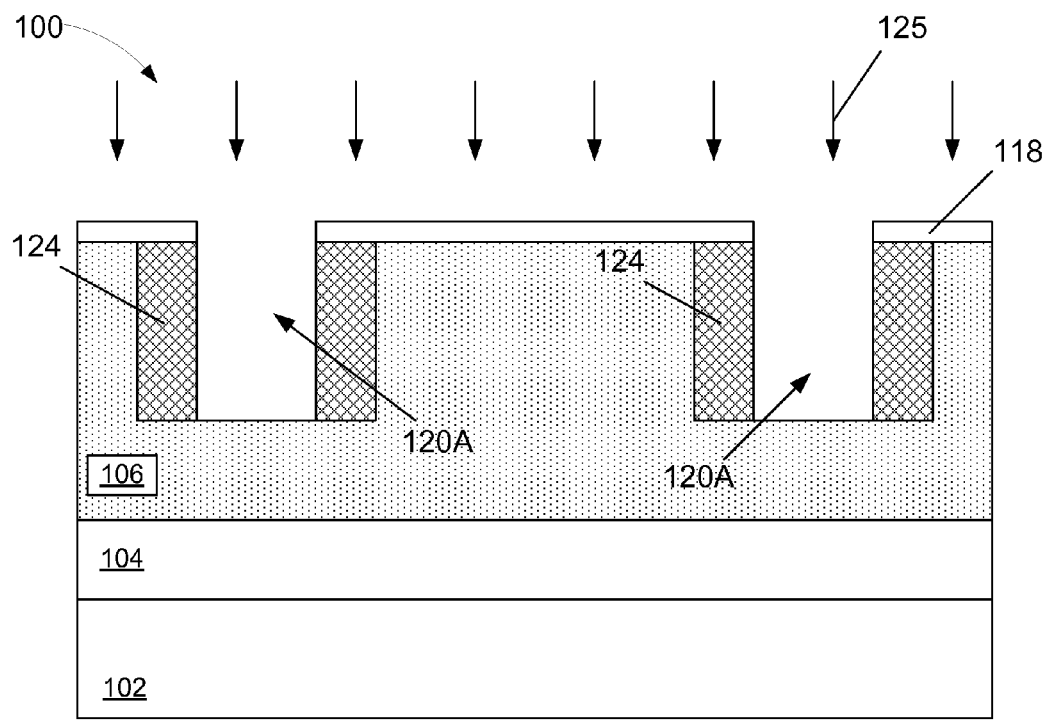

FIG. 2C depicts the product 100 after a timed, anisotropic dry etch process 125 (e.g., reactive ion etching) was performed through the patterned cap layer 118 to remove the damaged insulating material 106 from the bottom of the trenches 120. This results in an extension of the initial depth of the initial trenches 120 to a second depth that is greater than the first depth so they have now been re-labeled with the reference number 120A to reflect their post-etch second-depth configuration.

Figure 2D:
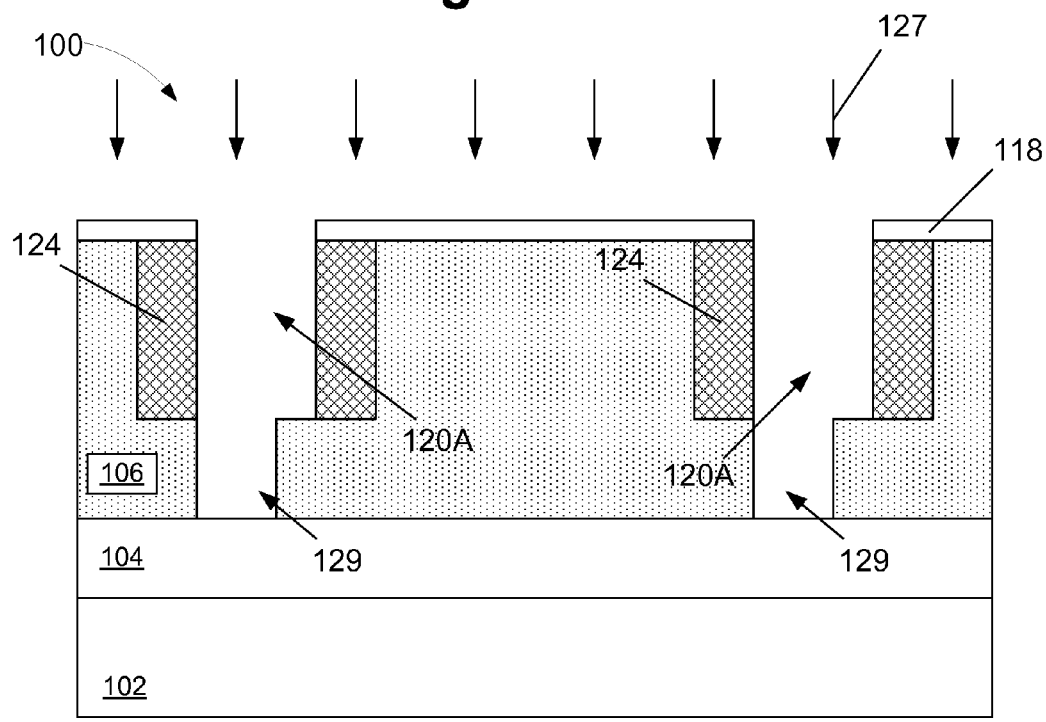

FIG. 2D depicts the product 100 after an etching process was performed through a patterned etch mask (not shown), e.g., a patterned layer of photoresist, so as to define a plurality of via openings 129 in the layer of insulating material 106.

Figure 2E:
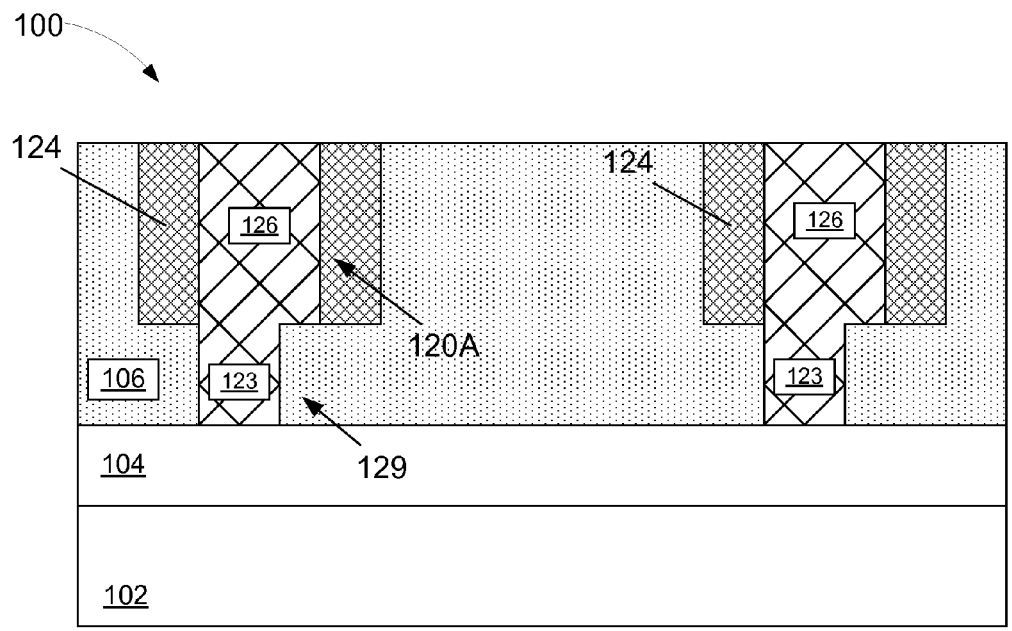

FIG. 2E depicts the product 100 after illustrative and simplistically depicted conductive lines 126 (e.g., copper lines) and vias 123 were formed in the trenches 120A and the via openings 129. The conductive lines 126 and vias 123 typically also include one or more barrier layers (not separately shown) that are formed between the damaged regions 124 in the insulating material 106 and the copper material of the lines 126 to prevent or reduce electromigration of the copper material. Such barrier layers (not shown) are also typically present between the conductive vias 123 and the layer of insulating material 106. In the case where the conductive lines 126 and vias 123 are comprised of copper, a typical process of forming the conductive lines 126 and vias 123 includes the following steps. First, a conformal barrier layer (not separately shown) is deposited on the product 100 such that it lines the bottom surface and sidewalls of the trenches 120A and the via openings 129. Next, a thin copper seed layer (not separately shown) is formed on the product 100, followed by performing an electroplating process to deposit bulk copper material in such quantities that it overfills the trenches 120A. Thereafter, one or more CMP processes are performed to remove excess conductive materials positioned outside of the trenches 120A. These CMP processes also remove the patterned cap layer 118.

Figure 2F:
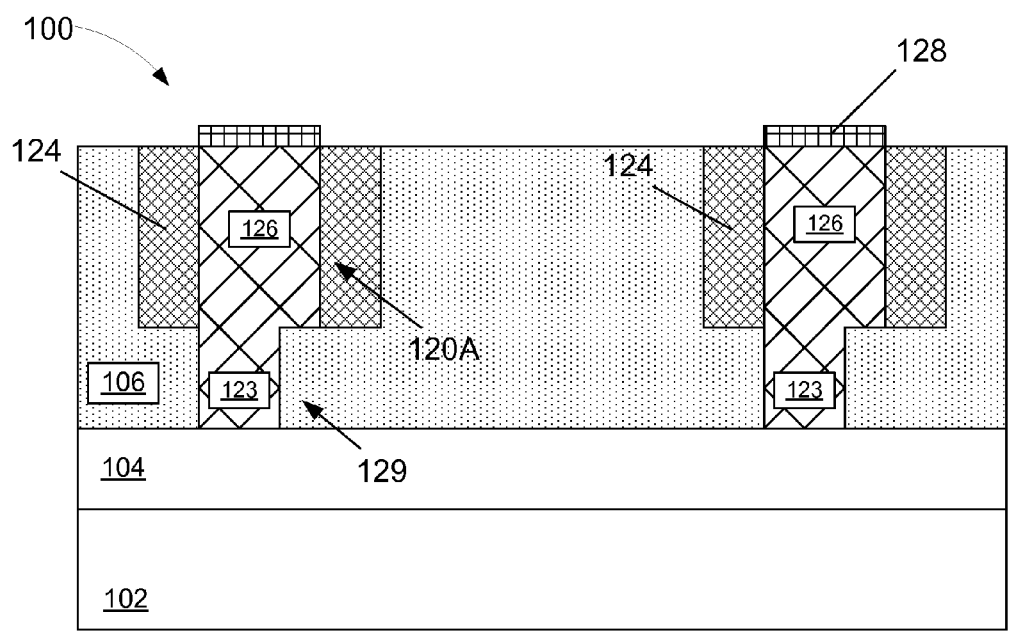

FIG. 2F depicts the product 100 after a selective deposition process was performed to selectively form a conductive cap layer 128, e.g., cobalt on the conductive lines 126.

Figure 2G:
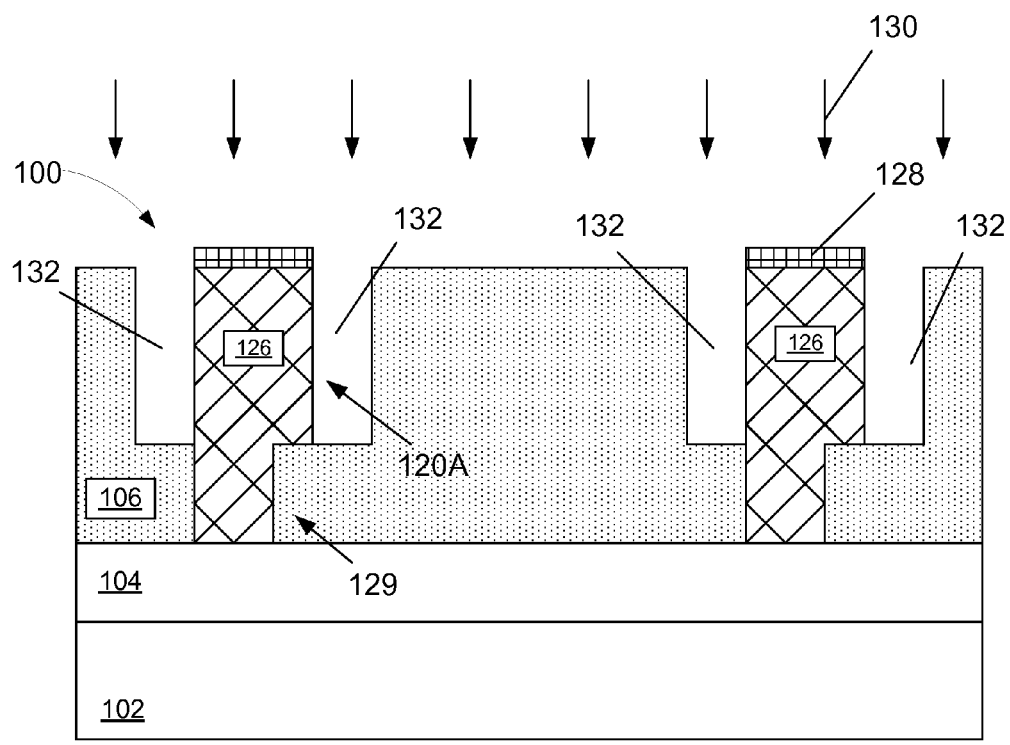
Figure 2H:
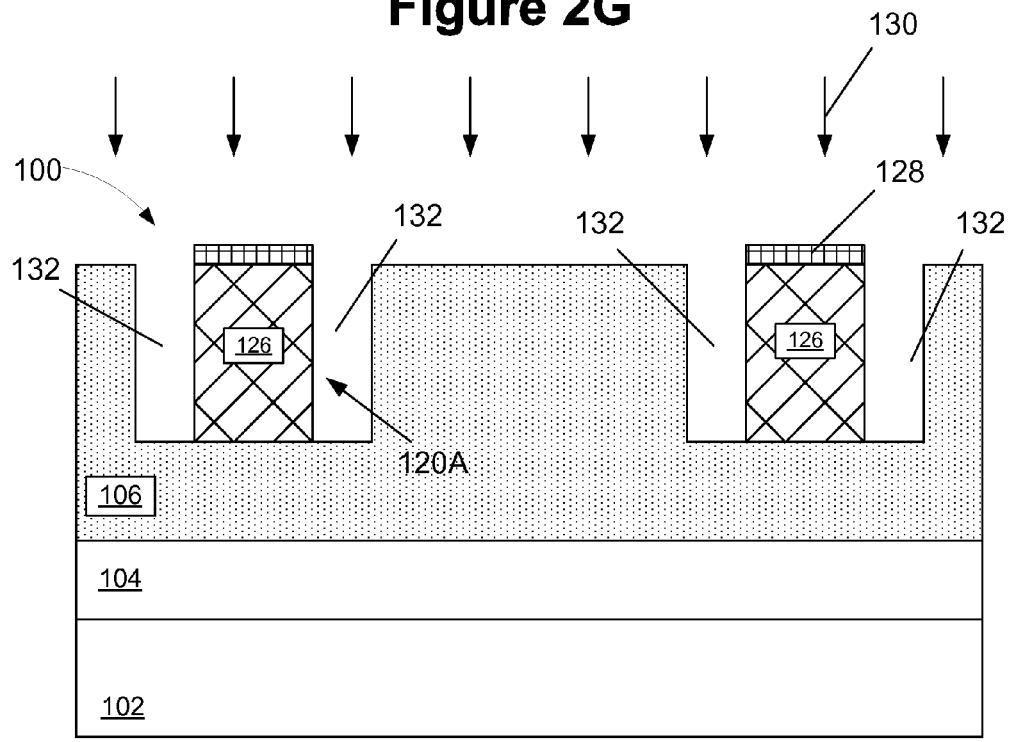

FIGS. 2G-2H depict the product 100 after an etching process 130 was performed to remove the damaged regions 124 selectively to the non-damaged portions of the layer of insulating material 106. FIG. 2G is a cross-sectional view taken through both the conductive lines 126 and the vias 123, while FIG. 2H is a cross-sectional view taken through just the conductive lines 126 in a location where the conductive vias 123 are not formed. In one illustrative embodiment, the etching process 130 may be a wet etching process using diluted HF. This results in the formation of air gaps 132 adjacent the conductive lines 126, e.g., adjacent opposites sides of each of the conductive lines 126. The air gaps 132 have approximately the same dimensions of the corresponding damaged regions 124 that were removed.

Figure 2I:
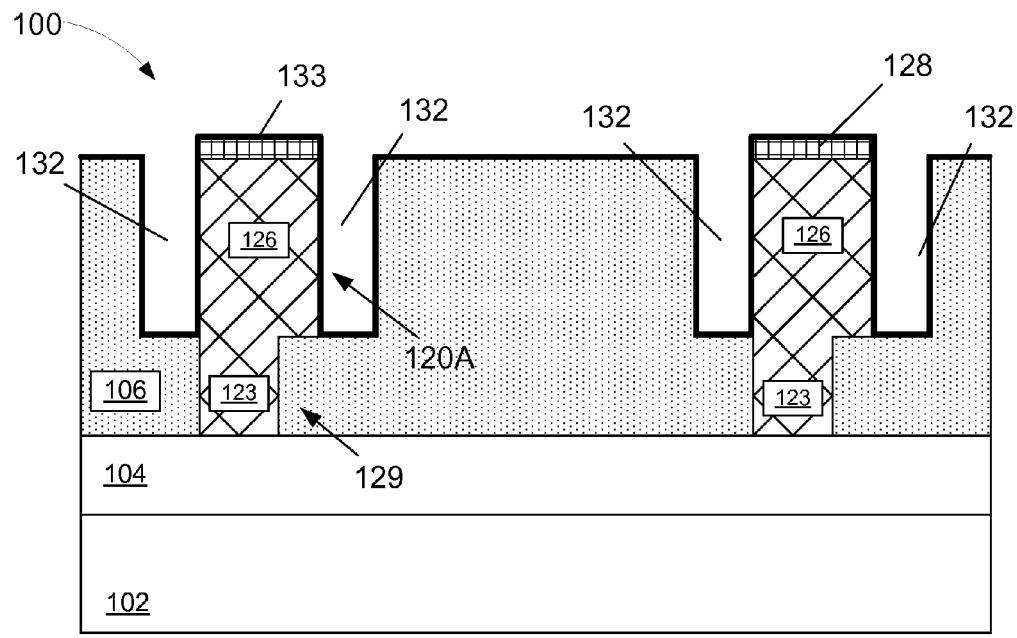
Figure 2J:
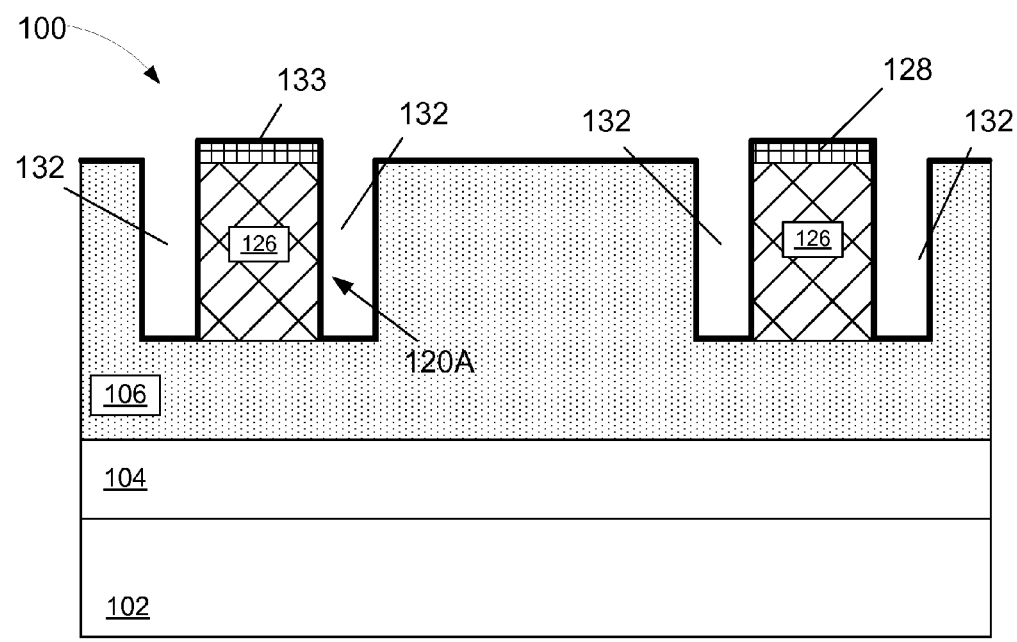

FIGS. 2I-2J depict the product 100 after a conformal deposition process was performed to form a relatively thin (e.g., 2-5 nm) conformal etch stop layer 133, e.g., silicon nitride, on the product 100 and particularly on the insulating material 106 and the conductive lines 126. FIG. 2I is a cross-sectional view taken through both the conductive lines 126 and the vias 123, while FIG. 2J is a cross-sectional view taken through just the conductive lines 126 in a location where the conductive vias 123 are not formed. The etch stop layer 133 can be used as an etch stop in forming conductive structures in another metallization layer (not shown) that will be formed above the illustrative metallization layer depicted herein.

Figure 2K:
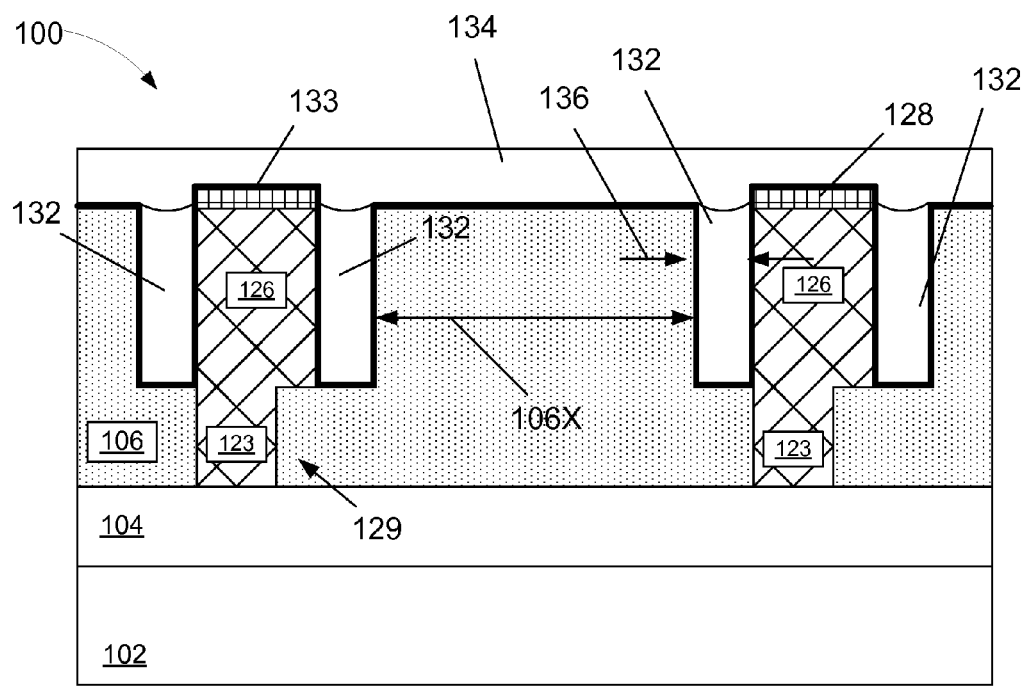
Figure 2L:
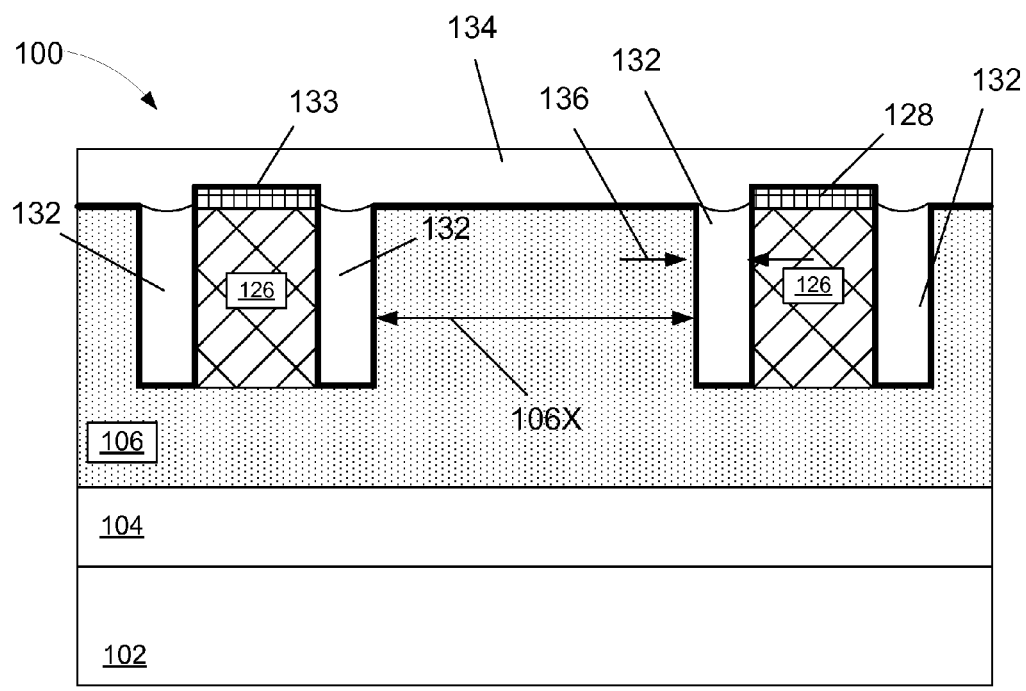

FIGS. 2K-2L depict the product 100 after a layer of material 134, i.e., a capping layer, was formed on the product 100 and after a CMP process was performed to planarize its upper surface. FIG. 2K is a cross-sectional view taken through both the conductive lines 126 and the vias 123, while FIG. 2L is a cross-sectional view taken through just the conductive lines 126 in a location where the conductive vias 123 are not formed. The capping layer of material 134 may be comprised of a material such as silicon nitride, and it may be formed to a thickness of about 10-30 nm. The lateral spacing 136 between the conductive lines 126 and the remaining portions of the non-damaged insulating material 106 is small enough (e.g., 0.5-5 nm) such that the capping layer of material 134 does not fill a substantial portion of that lateral space 136. This results in the formation of air gaps 132 between the adjacent conductive lines 126. The remaining portion 106X of the undamaged insulating material 106 may have a lateral width on the order of about 2-10 nm. Thus, unlike the prior art process described in the background section of this application, some of the insulating material (106X) remains positioned between the conductive lines 126 instead of simply being an open air space. The presence of the material 106X reduces leakage between the adjacent conductive lines 126. Moreover, in prior art processing techniques, where an ashing process was performed to remove a patterned layer of photoresist, some undesirable damage of an underlying layer of insulating material may have occurred. In such situations, efforts were made to "repair" the damaged insulating material by using SiCOH, SiCNH, CxHy, etc. based chemicals to form a thin film coating the damaged surface in an attempt to restore the dielectric constant and restore the film hydrophobicity, with or without UV assisted, plasma enhanced or atomic layer deposition. Using the novel process flow described herein, there is no need to make such repairs as the damaged regions 124 are intentionally formed so as to be relatively large and they are later selectively removed relative to the undamaged portions of the layer of insulating material 106.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of laterally spaced-apart trenches in a layer of insulating material;
    performing at least one damage-causing process operation to selectively damage portions of said layer of insulating material adjacent said trenches while leaving another portion of said layer of insulating material positioned laterally between said laterally spaced-apart trenches undamaged by said at least one damage-causing process operation;
    forming a conductive line in each of said laterally spaced-apart trenches;
    after forming said conductive lines, performing a selective etching process to selectively remove at least portions of said damaged portions of said layer of insulating material and thereby define an air gap cavity positioned laterally adjacent each of said conductive lines;
    performing a conformal deposition process to form a conformal etch stop liner layer on an upper surface of said layer of insulating material, above said conductive lines, and lining said air gap cavities without covering said air gap cavities; and
    forming a capping layer of material after forming said conformal etch stop liner layer, wherein said capping layer is formed above said conductive lines and said layer of insulating material without filling said air gap cavities, thereby defining an air gap positioned laterally adjacent each of said conductive lines.

2. The method of claim 1, wherein performing said at least one damage-causing process operation damages portions of said layer of insulating material positioned adjacent sidewalls and a bottom surface of said trenches.

3. The method of claim 1, wherein said capping layer of material is formed on and in contact with said conformal etch stop liner layer.

4. The method of claim 1, wherein said conductive lines are comprised of copper, said conformal etch stop liner layer is comprised of silicon nitride, said layer of insulating material is comprised of a low-k material and said capping layer of material is comprised of silicon nitride.

5. The method of claim 1, wherein performing said at least one damage-causing process operation comprises performing an ashing process operation.

6. The method of claim 5, wherein performing said ashing process operation comprises performing an $O_2$, $O_3$ or $N_2O$ based ashing process.

7. The method of claim 1, wherein performing said at least one damage-causing process operation comprises performing a wet clean process operation.

8. The method of claim 7, wherein performing said wet clean process comprises performing said wet clean process using TMAH (tetramethylammonium hydroxide) as a cleaning agent during said wet clean process.

9. The method of claim 1, further comprising, after forming said damaged portions in said layer of insulating material, performing an anisotropic etching process to extend an initial depth of said trenches to a second greater depth that is greater than said initial depth and to remove a portion of said damaged portions of said layer of insulating material positioned at a bottom of said initial depth trenches while leaving remaining portions of said damaged portions of said layer of insulating material positioned adjacent sidewalls of said trenches with said second depth intact.

10. The method of claim 9, further comprising, after performing said anisotropic etching process, performing a via etching process to define a via opening in said layer of insulating material under each of said second depth trenches, wherein said via opening extends to an underlying layer of material.

11. A method, comprising:
    forming a plurality of laterally spaced-apart trenches in a layer of insulating material, said trenches having an initial depth;
    performing at least one damage-causing process operation to selectively damage portions of said layer of insulating material adjacent said initial depth trenches while leaving another portion of said layer of insulating material positioned laterally between said laterally spaced-apart initial depth trenches undamaged by said at least one damage-causing process operation;
    performing an anisotropic etching process to extend said initial depth of said initial depth trenches to a second depth that is greater than said initial depth and to remove a portion of said damaged portions of said layer of insulating material positioned at a bottom of said initial depth trenches while leaving remaining portions of said damaged portions of said layer of insulating material positioned adjacent sidewalls of said trenches with said second depth intact;
    forming a conductive line in each of said laterally spaced-apart trenches having said second depth;
    after forming said conductive lines, performing a selective etching process to selectively remove said damaged portions of said layer of insulating material and thereby define an air gap cavity positioned on opposite sides of each of said conductive lines;
    performing a conformal deposition process to form a conformal etch stop liner layer on an upper surface of said layer of insulating material, above said conductive lines, and lining said air gap cavities without covering said air gap cavities; and
    forming a capping layer of material after forming said conformal etch stop liner layer, said capping layer being formed on and in contact with a portion of said conformal etch stop liner layer disposed above said upper surface of said layer of insulating material and above said conductive lines without filling said air gap cavities, thereby defining an air gap positioned on opposite sides of each of said conductive lines.

12. The method of claim 11, wherein performing said at least one damage-causing process operation comprises performing an ashing process operation.

13. The method of claim 11, wherein performing said at least one damage-causing process operation comprises performing a wet clean process operation.

14. The method of claim 11, wherein performing said at least one damage-causing process operation damages portions of said layer of insulating material positioned adjacent said sidewalls and said bottom surface of said initial depth trenches.

15. The method of claim 11, further comprising, after performing said anisotropic etching process, performing a via etching process to define a via opening in said layer of insulating material under each of said second depth trenches, wherein said via opening extends to an underlying layer of material.

16. A method, comprising:
  forming a plurality of laterally spaced-apart trenches in a layer of insulating material, said trenches having an initial depth;
  performing at least one damage-causing process operation to selectively damage portions of said layer of insulating material adjacent said initial depth trenches while leaving another portion of said layer of insulating material positioned laterally between said laterally spaced-apart initial depth trenches undamaged by said at least one damage-causing process operation, wherein said damaged portions of said layer of insulating material are positioned adjacent sidewalls and a bottom surface of said initial depth trenches;
  after forming said damaged portions in said layer of insulating material, performing an anisotropic etching process to extend a depth of said initial depth trenches to a second depth that is greater than said initial depth and to remove a portion of said damaged portions of said layer of insulating material positioned at said bottom of said initial depth trenches while leaving remaining portions of said damaged portions of said layer of insulating material positioned adjacent sidewalls of said trenches with said second depth intact;
  performing a via etching process to define a via opening in said layer of insulating material under each of said trenches with said second depth, wherein said via opening extends to an underlying layer of material;
  forming a conductive line in each of said laterally spaced-apart trenches with said second depth and a conductive via in each of said via openings;
  after forming said conductive lines, performing a selective etching process to selectively remove said damaged portions of said layer of insulating material and thereby define an air gap cavity positioned laterally adjacent each of said conductive lines;
  performing a conformal deposition process to form a conformal etch stop liner layer on an upper surface of said layer of insulating material, above said conductive lines, and lining said air gap cavities without covering said air gap cavities; and
  forming a capping layer of material after forming said conformal etch stop liner layer, said capping layer being formed on said conformal etch stop liner and above said conductive lines without filling said air gap cavities, thereby defining an air gap positioned on opposite sides of each of said conductive lines.

17. The method of claim 16, wherein performing said at least one damage-causing process operation comprises performing an ashing process operation.

18. The method of claim 16, wherein performing said at least one damage-causing process operation comprises performing a wet clean process operation.

19. The method of claim 16, wherein performing said at least one damage-causing process operation damages portions of said layer of insulating material positioned adjacent said sidewalls and said bottom surface of said trenches.

* * * * *